United States Patent
Hiraki

(10) Patent No.: US 9,054,703 B2
(45) Date of Patent: Jun. 9, 2015

(54) DEVICE FOR DETECTING DRIVE CURRENT OF PWM LOAD DEVICE, DRIVE CURRENT DETECTION METHOD, FAULT DETECTION DEVICE, AND FAULT DETECTION METHOD

(75) Inventor: Tatsushi Hiraki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 740 days.

(21) Appl. No.: 13/319,595

(22) PCT Filed: May 27, 2010

(86) PCT No.: PCT/JP2010/003562
§ 371 (c)(1),
(2), (4) Date: Nov. 9, 2011

(87) PCT Pub. No.: WO2010/137327
PCT Pub. Date: Dec. 2, 2010

(65) Prior Publication Data
US 2012/0049858 A1  Mar. 1, 2012

(30) Foreign Application Priority Data
May 29, 2009  (JP) .................................. 2009-129874

(51) Int. Cl.
*H01H 31/02* (2006.01)
*G01R 31/00* (2006.01)
(Continued)

(52) U.S. Cl.
CPC . *H03K 17/18* (2013.01); *H03K 7/08* (2013.01)

(58) Field of Classification Search
CPC .................................. H03K 17/18; H03K 7/08
USPC ................................ 324/96, 555; 340/815.45
See application file for complete search history.

(56) References Cited

U.S. PATENT DOCUMENTS 5,481,194 A * 1/1996 Schantz et al. ................. 324/522
6,011,416 A * 1/2000 Mizuno et al. ................. 327/108
(Continued)

FOREIGN PATENT DOCUMENTS

JP  6-15557    1/1994
JP  7-227095   8/1995
(Continued)

OTHER PUBLICATIONS

International Preliminary Report on Patentability issued Dec. 22, 2011 in International (PCT) Application No. PCT/JP2010/003562.
(Continued)

*Primary Examiner* — Melissa Koval
*Assistant Examiner* — Farhana Hoque
(74) *Attorney, Agent, or Firm* — Wenderoth, Lind & Ponack, L.L.P.

(57) ABSTRACT

It is an object of the invention to, in fault detection of a PWM load device, provide a fault detection device and a fault detection method, which are capable of appropriately detecting fault of the load device in the case where such load device is connected the duty ratio of the PWM waveform of which is different, or where such load device is connected the magnitude of current of which is different. The fault detection device samples a current flowing through the load device on a predetermined cycle, decides, based on sampled values, a current-driven period and decides, by using sampled values in the current-driven period, a drive current value for determining whether or not there is a fault.

15 Claims, 3 Drawing Sheets

(51) Int. Cl.
*H02H 3/00* (2006.01)
*H03K 17/18* (2006.01)
*H03K 7/08* (2006.01)

(56) References Cited

U.S. PATENT DOCUMENTS

| | | | |
|---|---|---|---|
| 6,922,643 B2 * | 7/2005 | Takakamo et al. | 702/58 |
| 2006/0226704 A1 * | 10/2006 | Tsuchiya | 307/32 |
| 2007/0085521 A1 * | 4/2007 | Nagai | 323/283 |

FOREIGN PATENT DOCUMENTS

| | | |
|---|---|---|
| JP | 10-41797 | 2/1998 |
| JP | 2007-306051 | 11/2007 |

OTHER PUBLICATIONS

International Search Report issued Jul. 20, 2010 in International (PCT) Application No. PCT/JP2010/003562.

* cited by examiner

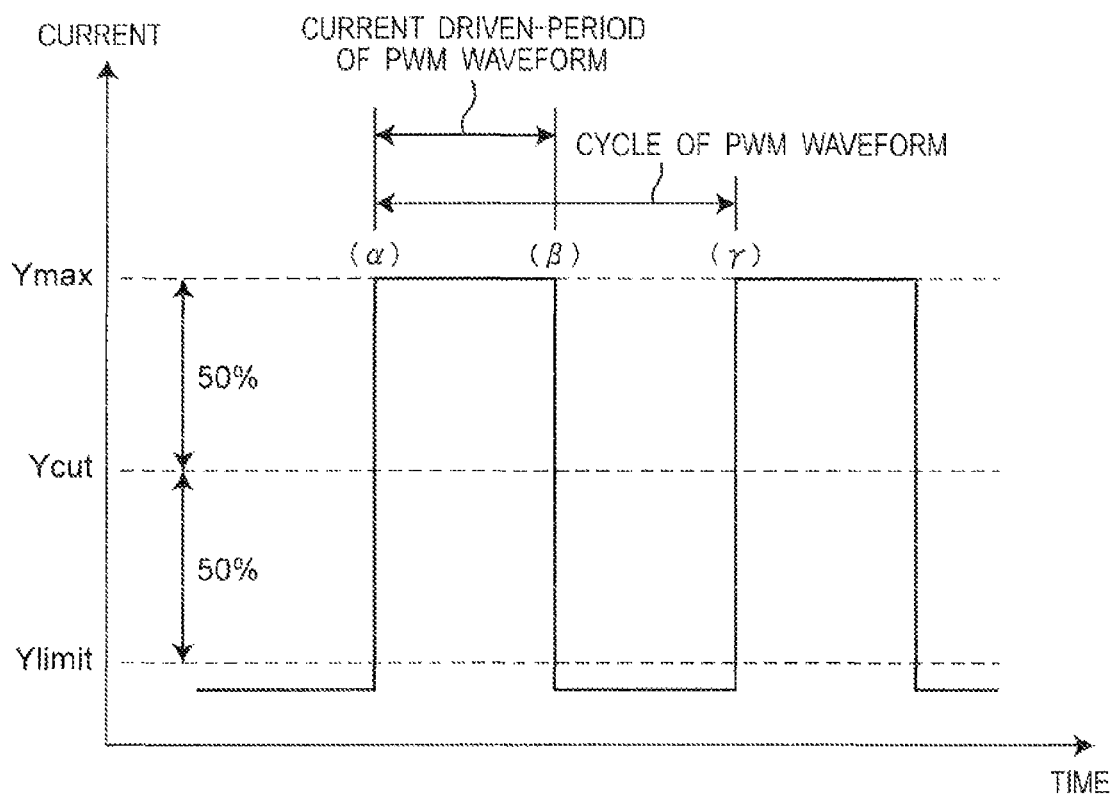

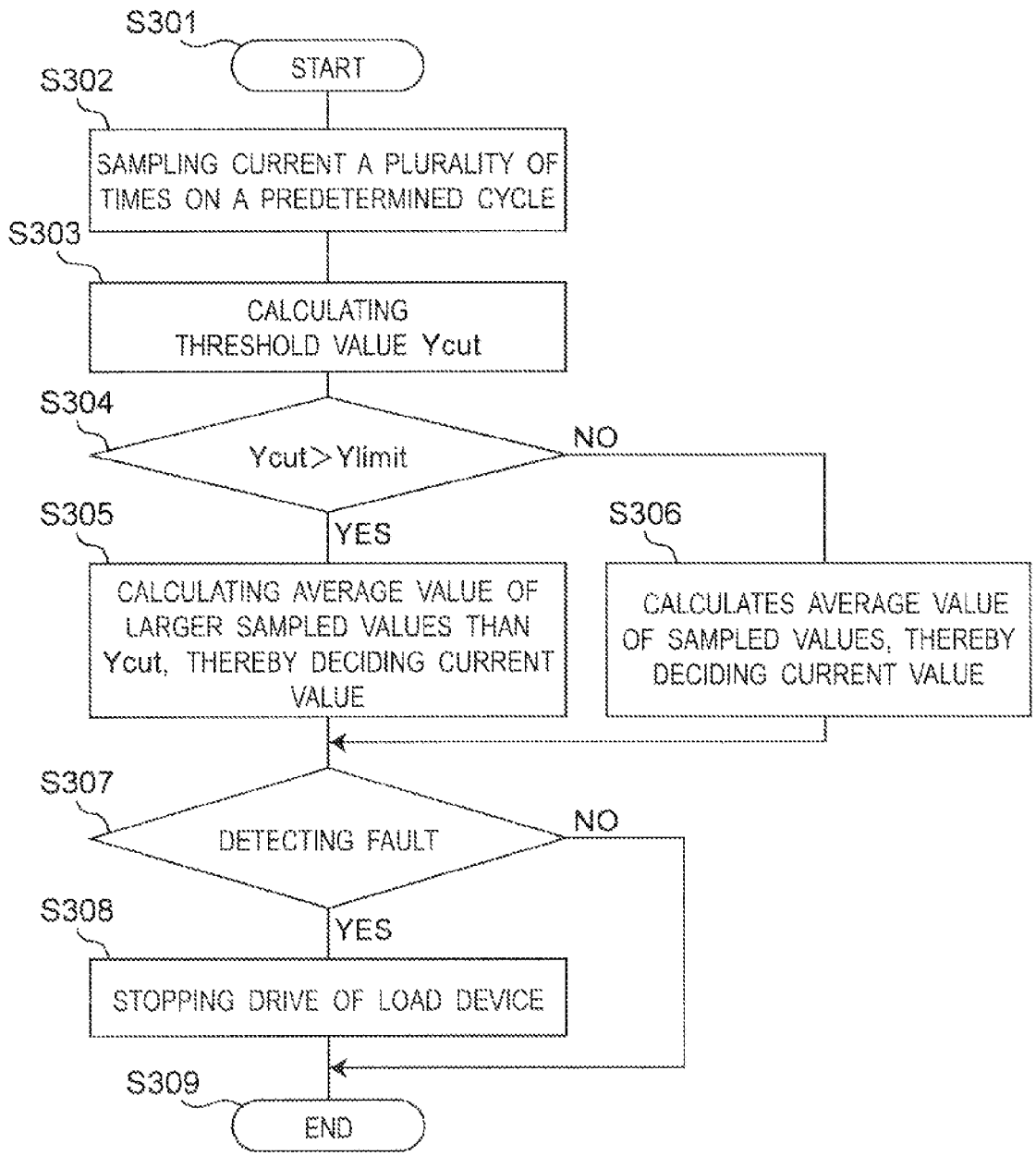

DEVICE FOR DETECTING DRIVE CURRENT OF PWM LOAD DEVICE, DRIVE CURRENT DETECTION METHOD, FAULT DETECTION DEVICE, AND FAULT DETECTION METHOD

TECHNICAL FIELD

The present invention relates to a device for detecting a drive current of a load device in which a drive voltage or a drive current is controlled in a PWM (Pulse Width Modulation) mode, to a drive current detection method, to a fault detection device, and to a fault detection method.

BACKGROUND ART

As a load device, there can be mentioned a constant current load device such as a resistor, which consumes a constant current, and a PWM load device such as an TED light, in which a drive voltage or a drive current is controlled in a PWM mode. Here, the PWM mode is a mode, in which an output of an electrical signal, such as a voltage and a current, is turned ON and OFF, to thereby generate a rectangular wave pulse signal, and then the load device is controlled by the pulse signal concerned.

In the case of attempting to detect a fault of the constant current load device, such as an overload state, a short circuit of the load and an unconnected state, investigation as to whether or not there is a current to be consumed in the load is performed at arbitrary timing. Meanwhile, in Patent Document 1, it is disclosed that, in the case of attempting to detect a fault of the PWM load device, a consumption current thereof is periodically sampled a plurality of times, a predetermined arithmetic operation is performed by using all results of the sampling, and a result of the arithmetic operation is used appropriately.

Note that, in general, two types can be mentioned as a driving method of the PWM load device. One is a driving method, in which the drive voltage is controlled in the PWM mode, and is supplied to the load device. In this case, in response to the supplied voltage, the load device consumes the current (that is, flows the drive current) in a period when the voltage is ON. Other is a driving method, in which, though a constant voltage is supplied, the drive current is controlled in the PWM mode and is supplied to the load device. In either case of the driving methods, a consumption current subjected to the pulse width modulation, which corresponds to a PWM drive, flows through the load device.

PRIOR ART DOCUMENT

Patent Document

Patent Document 1: JP 07-227095 A

DISCLOSURE OF INVENTION

Problems to be Solved by the Invention

In the conventional fault detection device and fault detection method for the PWM load device, in the case where PWM load devices different from each other in duty ratio of the PWM control, for example, one with a duty ratio of 5% and one with a duty ratio of 95% are connected thereto, such a phenomenon occurs, in which, depending on the duty ratio, a current at one sampling point becomes a current in a current conducting period (that is, a period when the current is ON) and becomes a current in a current non-conducting period (that is, a period when the current is OFF). Then, a calculation of the drive current for detecting the fault cannot be performed correctly, and there has been a problem that a fault state cannot be therefore detected accurately.

It is an object of the present invention to provide a drive current detection device and a drive current detection method, which are capable of appropriately performing the detection of a drive current value for detecting the fault in the case where the load devices different from each other in duty ratio of a PWM waveform are connected thereto in detecting the fault of the PWM load device. Moreover, it is another object of the present invention to provide a fault detection method and a fault detection device, which are capable of accurately detecting the fault of the PWM load device based on the appropriately detected drive current value.

Means for Solving the Problems

In order to solve the above-described problem, a drive current detection device according to the present invention is a drive current detection device for a load device in which a drive voltage or a drive current is controlled in a PWM mode,
the drive current detection device including:
a sampling unit that periodically samples a current a plurality of times, the current flowing through the load device; and
a drive current arithmetic operation unit that, based on sampled values, decides a current-driven period in the current flowing through the load device, further, selects sampled values in the current-driven period from among the sampled values, and decides a drive current value for determining whether or not there is a fault in the load device.

Moreover, a fault detection device according to the present invention includes:
the above-mentioned drive current detection device; and
a fault determination unit that performs detection of a fault of the load device by using the drive current value for determining whether or not there is a fault in the load device, the drive current value being decided by the drive current detection device.

Moreover, a drive current detection method according to the present invention is a drive current detection method for a load device in which a drive voltage or a drive current is controlled in a PWM mode, the drive current detection method including:
periodically sampling a current a plurality of times, the current flowing through the load device;
deciding, based on sampled values, a current-driven period in the current flowing through the load device; and
selecting sampled values in the current-driven period from among the sampled values, and deciding a drive current value for determining whether or not there is a fault in the load device.

Furthermore, a fault detection method according to the present invention is characterized in that the detection of a fault in the load device is performed by using the drive current value for determining whether or not there is a fault, the drive current value being decided by the above-mentioned drive current detection method.

Effect of the Invention

In accordance with the present invention, among the sampled current values, the sampled values in the current-driven period are used for deciding the drive current value. That is to say, even in the case where a PWM load device in which the duty ratio of the PWM waveform is different is connected, the current value in the current non-conducting period is not used for deciding the drive current value. As a result, the calculation of the drive current value for detecting the fault can be performed correctly, and hence, the fault of the PWM load device can be detected accurately. Furthermore, the voltage output to the PWM load device is stopped based on the detection of the fault, whereby protection of the load drive device and protection of the PWM load device can be achieved.

BRIEF DESCRIPTION OF DRAWINGS

FIG. 2 is a graph showing a relationship between a threshold value (Ycut) and a current waveform in a PWM load device in which a current is controlled in a PWM mode, the current waveform being monitored by the fault detection device of Embodiment 1.

FIG. 3 is a flowchart showing fault detection processing in the fault detection device of Embodiment 1.

BEST MODE FOR CARRYING OUT THE INVENTION

Figure 1:
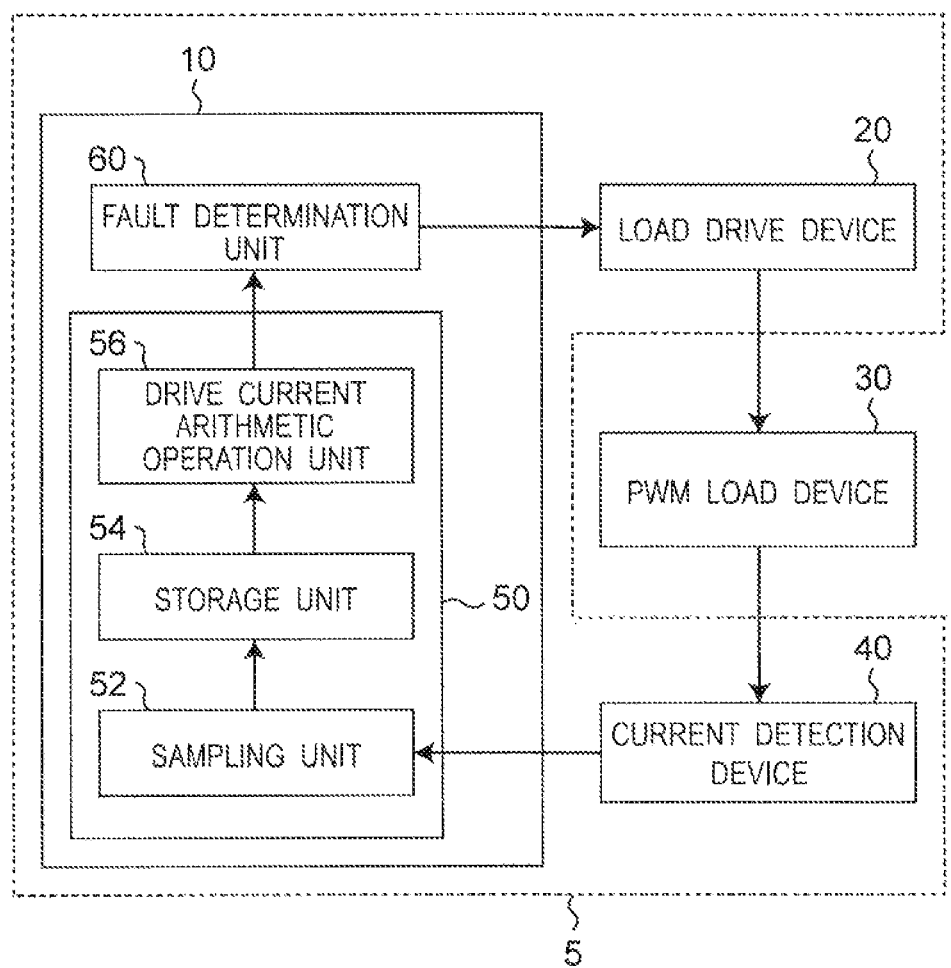
FIG. 1 is a block diagram showing a configuration of a fault detection device according to Embodiment 1 of the present invention.

A description is made below of a drive current detection device, a drive current detection method, a fault detection device and a fault detection method for a PWM load device, which are according to embodiments of the present invention, while referring to the drawings.

1. Embodiment 1

1.1. Configuration of Fault Detection Device

FIG. 1 is a block diagram showing a configuration of a fault detection device 10 according to Embodiment 1 of the present invention. The block diagram of FIG. 1 shows a load drive device 20, a PWM load device 30 and a current detection device 40 in addition to the fault detection device 10. The load drive device 20 supplies a voltage of a PWM waveform or a constant voltage to the PWM load device 30. The PWM load device 30 is a load device in which a drive voltage or a drive current is controlled in a PWM mode. The current detection device 40 is a device that continuously detects the current flowing through the PWM load device 30.

The fault detection device 10 shown in FIG. 1 includes a drive current detection unit 50 and a fault determination unit 60. The drive current detection unit 50 is composed of a sampling unit 52, a storage unit 54 and a drive current arithmetic operation unit 56. For a predetermined time, the sampling unit 52 periodically performs sampling for current values of the current, which are continuously measured in the current detection device 40. Data of the sampled current values is stored in the storage unit 54. By using such sampled values stored in the storage unit 54, the drive current arithmetic operation unit 56 calculates a drive current value of a period (hereinafter, referred to as a "current-driven period") when the current is driven in a PWM waveform current flowing through the PWM load device 30.

The fault determination unit 60 determines whether or not there is a fault in the PWM load device 30 by using the drive current value calculated by the drive current arithmetic operation unit 56 in the drive current detection unit 50. Moreover, the fault determination unit 60 is configured to be capable of transmitting, to the outside, determination information as to whether or not there is a fault.

Note that a description is made later in detail of a specific sampling method by the sampling unit 52, a specific calculation method of the drive current value by the drive current arithmetic operation unit 56, and a specific determination method for determining whether or not there is a fault by the fault determination unit 60.

As shown in FIG. 1, the fault detection device 10 according to Embodiment 1 of the present invention is connected to the load drive device 20, the PWM load device 30 and the current detection device 40, thereby performing fault detection for the PWM load device 30. Here, supply and stop of the voltage by the load drive device 20 are made settable from the outside. Hence, if the fault determination unit 60 of the fault detection device 10 determines that a fault is present in the PWM load device 30, then the fault determination unit 60 transmits a signal, which instructs stop of voltage supply, to the load drive device 20 based on information indicating that a fault is present. The fault determination unit 60 may include a function to directly stop the voltage supply by the load drive device 20.

Note that, as shown by a dotted line 5 in FIG. 1, the fault detection device 10, the load drive device 20 and the current detection device 40 may be combined with one another, whereby a load drive device 5 that incorporates the fault detection device therein may be composed.

1.2. Operations of Fault Detection Device

Next, FIG. 2 is a graph showing a relationship between a threshold value (Ycut) and the waveform of the current flowing through the PWM load device 30 in which the drive voltage or the drive current is controlled in the PWM mode, such a current waveform being monitored by the fault detection device 10 of this embodiment. Moreover, FIG. 3 is a flowchart showing fault detection processing in the fault detection device 10 of this embodiment. A graph of a solid line in FIG. 2 shows a time change of the current flowing through the PWM load device 30.

A description is made below of operations of the fault detection device according to this embodiment by using FIG. 2 and FIG. 3. First, in the flowchart of FIG. 3, processing S301 shows a start of the fault detection.

The current detection device 40 continuously measures the current flowing through the PWM load device 30, and outputs the values of the measured current to the sampling unit 52. In response to this, the sampling unit 52 periodically samples thus inputted current values a plurality of times for a predetermined time in processing S302. The current values thus sampled are stored in the storage unit 54.

The predetermined time for the sampling, that is to say, a time from a start of the sampling by the sampling unit 52 to an end thereof is set at a time longer than a cycle (a maximum value thereof) of the PWM waveform. When the current waveform shown in FIG. 2 is taken as an example, a time longer than a period between ($\alpha$) and ($\gamma$) (that is, the cycle of the PWM waveform) is set as the predetermined time for the sampling.

Moreover, a sampling cycle is decided so that the current value can be sampled at least once within the current-driven period (a minimum value thereof) of the PWM waveform. When the current waveform shown in FIG. 2 is taken as an example, a time shorter than a period between ($\alpha$) and ($\beta$) (that is, the current-driven period) is set as the sampling cycle.

For example, in the case where, in the PWM load device 30, the maximum value of the cycle of the PWM waveform is 4 ms (milliseconds), and the minimum value of the time of the current-driven period is 400 μs (microseconds), then the predetermined time for the sampling is set at 4 ms or more, and the sampling cycle is set at 400 μs or less. In the case where plural types of the PWM load devices 30 are connected, preferably, the maximum cycle of the PWM waveform in those PWM load devices or a time longer than the maximum cycle is set as the predetermined time for the sampling, and the minimum time of the current-driven period or shorter in those PWM load devices is set as the sampling cycle.

Here, a description is made of Ymax, Ylimit, Ycut in FIG. 2. First, Ymax is the maximum value of the sampled current values.

Ylimit is a lower limit value of measurable currents. This lower limit value depends on performance of the current detection device 40 or the like. That is to say, by the current detection device 40, a current smaller than Ylimit cannot be measured accurately. For example, there is a case where the current detection device does not ensure accuracy for a measurement value with regard to a current of 10 mA (milliamperes) or less even if the current detection device has performance capable of measuring a current by resolving power of 1 mA. In such a case, Ylimit is "10 mA".

Ycut is a threshold value for deciding the current-driven period. That is to say, a current with a current value larger than Ycut is determined to be a current that is included in the current-driven period in the PWM waveform current, and a current with a current value equal to or less than Ycut is determined to be a current that is not included in the current-driven period in the PWM waveform current. In FIG. 2, the PWM waveform is illustrated as a perfect rectangular wave, and the PWM waveform is illustrated on the assumption that changes thereof in rise and drop of a pulse occur in a short time that is sufficiently ignorable. However, Ycut is decided as described above, whereby the current-driven period of the PWM waveform can be accurately defined even in the case where it takes a considerable time for the changes in the rise and drop of the pulse.

An arithmetic expression for calculating Ycut is definable in various ways. As an example, a value of Ycut shown in FIG. 2 can be calculated by the following arithmetic expression.

$$Ycut=(Ymax-Ylimit)/2+Ylimit$$

In accordance with the above-described arithmetic expression, in the case where a value of Ylimit is 0, Ycut becomes an intermediate value of the maximum value of the sampled current, that is, a half value (50%) of the maximum value Ymax.

The above-described arithmetic expression for calculating Ycut is a function of Ymax, and accordingly, the value of Ycut is decided in response to the sampled current value. Hence, even in the case where the PWM load devices 30 different from one another in magnitude of the drive current are connected, the value of Ycut as the threshold value for deciding the current-driven period is uniquely decided in response to the value of Ymax, and hence, the current-driven period is also decided uniquely in response to the value of Ymax.

Returning to FIG. 3, a description is made of processing S303 and after. In the processing S303, the drive current arithmetic calculation unit 56 calculates the value of Ycut in accordance with the above-mentioned arithmetic expression by using the current values sampled the plurality of times in the processing S302. Thereafter, in processing S304, the drive current arithmetic operation unit 56 determines a magnitude relationship between Ycut and Ylimit. In the case where Ycut is larger than Ylimit, the drive current arithmetic operation unit 56 performs a step of processing S305. In the processing S305, the drive current arithmetic operation unit 56 only selects larger values than Ycut (threshold value) among the current values sampled the plurality of times in the processing S302, and calculates an average value of the selected sample values, thereby deciding the drive current value for determining whether or not there is a fault.

Meanwhile, in the case where Ycut is equal to or less than Ylimit, the drive current arithmetic operation unit 56 performs a step of processing S306. In the processing S306, the drive current arithmetic operation unit 56 calculates an average value based on all of the current values sampled the plurality of times in the processing S302, thereby deciding the drive current value for determining whether or not there is a fault. The case where Ycut becomes equal to or less than Ylimit is, for example, an unconnected (open) state of the load. In usual, the current does not flow in such a case, and accordingly, the current value measured by the current detection device 40 becomes smaller than Ylimit.

Note that the case where Ycut becomes equal to or less than Ylimit is the case where the current-driven period is not present. Accordingly, in either case of obtaining the average value in accordance with the step of the processing S305 or in accordance with the step of the processing S306, the average value to be calculated becomes a value approximate to Ylimit or zero. Hence, in the flowchart shown in FIG. 3, the steps of the processing S304 and the processing S306 may be omitted.

Thereafter, in processing S307, the fault determination unit 60 compares the drive current value, which is calculated in the previous step (that is, the processing S305 or the processing S306), with a current value serving as a reference, thereby determining whether or not there is a fault in the PWM load device 30. The current value serving as the reference just needs to be decided based on an appropriate value when the PWM load device 30 operates, or decided based on specifications of the load drive device 20 for the PWM load device 30. Moreover, a plurality of the current values serving as the references may be set so as to correspond to plural types of the faults.

For example, in the case where rated output voltage and current of the load drive device 20 are 24 V/1 A, then 1.0 A and 0.1 A, which are two current values serving as the references, may be provided. When the drive current value calculated in the processing S305 or the processing S306 is 1.0 A or more, it may be determined that there is such a fault as an overload state and a short-circuit state of the load, and when the drive current value thus calculated is 0.1 A or less, it may be determined that there is such a fault as the unconnected (open) state of the load.

Moreover, as another example, if it is previously known that a load (PWM load device 30) that consumes a current of 0.2 A is connected to the load drive device 20, then 1.0 A, 0.3 A and 0.1 A, which are three current values serving as the references, may be provided. When the drive current value calculated in the processing S305 or the processing S306 is 1.0 A or more, it may be determined that there is such a fault as the short-circuit state of the load, when the drive current value thus calculated is 0.3 A or more to less than 1.0 A, it may be determined that there is a fault that is the overload state, and when the drive current value thus calculated is 0.1 A or less, it may be determined that there is such a fault as the unconnected (open) state of the load.

Moreover, in response to Ycut (threshold value) to be dynamically calculated based on the sampled current values, the current value serving as the reference may be dynamically set every time when Ycut is thus calculated.

The fault determination unit 60 performs a step of processing S308 when the fault is detected in the processing S307. In the processing S308, the fault determination unit 60 transmits a signal, which instructs the stop of the voltage supply, to the load drive device 20 based on information indicating that the fault is present. Upon receiving this signal, the load drive device 20 stops outputting the voltage to the PWM load device 30, thereby stopping the drive of the load. The drive of the load is stopped in this processing S308, whereby protection of the load drive device 20 and protection of the PWM load device 30 can be achieved. Note that the fault determination unit 60 may include a function to directly stop the voltage supply to the load drive device 20.

Note that the processing S308 shown in FIG. 3 is merely an example of the step that can be performed by using the information indicating whether or not there is a fault, the information being detected by the fault detection processing according to this embodiment. A step having different contents may be performed, or this step may be omitted.

The above-described operations (fault detection processing) of the fault detection device may be executed immediately after the PWM load device 30 is connected to the load drive device 20, may be periodically executed every fixed time after the PWM load device 30 is connected to the load drive device 20.

In the above-described operations of the fault detection device, the drive current arithmetic operation unit 56 selects the value of the current included in the current-driven period decided based on the sampled current values as basic data for calculating the drive current value for determining whether or not there is a fault. That is to say, even in the case where the PWM load device 30 in which the duty ratio of the PWM waveform is different is connected, the drive current value for determining whether or not there is a fault is calculated without fail, based on the current value in the period when the current is ON. Hence, the fault detection device according to this embodiment can correctly perform the detection of the drive current value for the fault detection.

2. Other Embodiments

In the PWM load device 30 connected to the load drive device 20, in some case, it is assumed that a rush current flows therein and noise is generated therein when the pulse of the PWM waveform is changed to rise and drop. For such a case, the drive current arithmetic operation unit 56 shown in FIG. 1 may calculate Ycut in the processing S303 after removing a largest sample value or a smallest sample value from the current values sampled by the sampling unit 52 in the processing S302 shown in FIG. 3. Note that, in this case, even after the sample values are removed in such a manner as described above, it is required that the sampling cycle be decided so that the current value in the current-driven period of the PWM waveform can be sampled at least once.

For example, in the PWM load device 30, in the case where the maximum value of the cycle of the PWM waveform is 4 ms, the minimum value of the time of the current-driven period is 400 μs, and the largest value among the sampled values and the smallest value thereamong are removed, then the predetermined time for the sampling is set at 4 ms or more, and the sampling cycle is set at 200 μs (=400/2) or less. In such a way, it becomes possible to ensure two or more sample values in the current-driven period, and even after the largest value is removed, at least one sample value remains in the current-driven period.

Moreover, in such a case where the current value of the PWM waveform on the outside of the current-driven period has a magnitude of a half or more of the current value in the current-driven period, and in such a case where the current value on the outside of the current-driven period is of a current sufficiently larger than Ylimit, then Ycut may be calculated by using the following arithmetic expression.

$$Ycut = (Ymax - Ymin)/2$$

In the above-described arithmetic expression, "Ymin" indicates the minimum value of the sampled current values. Note that the above-mentioned calculation method of Ycut is also merely an illustration. Other mathematical expressions (defining expressions) may be used as long as it is possible to obtain the threshold value for use in deciding the current-driven period of the PWM waveform.

Moreover, the embodiment of the present invention may be configured as follows.

For example, the sampling unit 52 does not directly sample the drive current flowing through the PWM load device 30, but may convert the drive current into a different one equivalent thereto, and may sample the different one concerned. As an example, the sampling unit 52 may flow the drive current through a resistor, and may sample a voltage value of a voltage generated in the resistor concerned.

Moreover, when the presence of the fault is detected, instead of stopping the drive of the PWM load device 30, or in combination with stopping the drive of the PWM load device 30, an external device may be notified of information, which indicates the presence of the fault, by using communication means such as Ethernet (registered trademark), a buzzer may be rung, and a warning lamp may be lighted.

Moreover, in the step of the processing S307 (shown in FIG. 3) for performing the fault detection, the fault determination unit 60 may determine that there is such a fault as the overload state or the short-circuit state of the load only when the drive current value for determining whether or not there is a fault is a predetermined reference value or more. Furthermore, the fault determination unit 60 may determine that there is such a fault as the unconnected (open) state of the load only when the drive current value for determining whether or not there is a fault is a predetermined reference value or less. Moreover, the fault determination unit 60 may determine that there is a fault in both of the cases. Furthermore, with regard to the drive current values for determining whether or not there is a fault, the fault determination unit 60 may define a plurality of ranges for classifying the drive current values concerned, and may output fault levels determined for each of the ranges in response to the calculated drive current values, thereby performing the detection of the fault.

Moreover, in the PWM load device, the fault detection method according to the embodiment of the present invention may be used for a period when the PWM waveform is not generated. In this case, whether or not there is a fault may be determined by also using the matter as to whether or not the voltage is outputted to the PWM load device 20. For example, in the period when the PWM waveform is not generated, it may be determined that the present state is normal in the case where the detection value of the current is sufficiently small, or the detection value of the current is less than Ylimit.

Moreover, the fault detection device and the fault detection method according to the embodiment of the present invention can be used also for a constant current load device driven by a constant current.

INDUSTRIAL APPLICABILITY

The present invention is useful as the fault detection method or the fault detection device for the load device such as an LED light, in which the drive voltage or the drive current is controlled in the PWM mode.

DESCRIPTION OF REFERENCE NUMERALS

10: FAULT DETECTION DEVICE
20: LOAD DRIVE DEVICE
30: PWM LOAD DEVICE
40: CURRENT DETECTION DEVICE
50: DRIVE CURRENT DETECTION UNIT
52: SAMPLING UNIT
54: STORAGE UNIT
56: DRIVE CURRENT ARITHMETIC OPERATION UNIT
60: FAULT DETERMINATION UNIT

The invention claimed is:

1. A drive current detection device for a load device in which a drive voltage or a drive current is controlled in a PWM mode, the drive current detection device comprising:
a sampling unit that periodically samples a current a plurality of times, the current flowing through the load device; and
a drive current arithmetic operation unit that (i) decides a threshold value based on sampled values, (ii) detects a current-driven period in the current flowing through the load device based on the threshold value, (iii) selects sampled values in the current-driven period from among the sampled values, and (iv) decides a drive current value for determining whether or not there is a fault in the load device.

2. The drive current detection device according to claim 1, wherein the sampling unit samples a current value outputted by a current detection device that measures the current flowing through the load device, and
the drive current arithmetic operation unit decides the threshold value from a maximum value among the sampled values and a lower limit value measurable by the current detection device.

3. The drive current detection device according to claim 1, wherein the drive current arithmetic operation unit decides the threshold value from a maximum value and a minimum value among the sampled values.

4. The drive current detection device according to claim 1, wherein the sampling unit samples a current value outputted by a current detection device that measures the current flowing through the load device, and
the drive current arithmetic operation unit removes a maximum value among the sampled values, and thereafter, decides the threshold value from a maximum value among the residual sampled values and a lower limit value measurable by the current detection device.

5. The drive current detection device according to claim 1 wherein the drive current arithmetic operation unit removes a maximum value and a minimum value among the sampled values, and thereafter, decides the threshold value from a maximum value and a minimum value among the residual sampled values.

6. The drive current detection device according to claim 1, wherein the drive current arithmetic operation unit decides an average value of the selected sampled values in the current-driven period as a drive current value for determining whether or not there is a fault in the load device.

7. The drive current detection device according to claim 1, wherein a time from a start of the sampling by the sampling unit to an end of the sampling is a time longer than a cycle of a PWM waveform.

8. The drive current detection device according to claim 1, wherein a sampling cycle by the sampling unit is decided so that a current value in the current-driven period of a PWM waveform can be sampled at least once.

9. The drive current detection device according to claim 1, wherein, in a case where plural types of PWM load devices are connected thereto,
a maximum cycle of a PWM waveform in the plural types of PWM load devices or a time longer than the maximum cycle is set as a time from a start of the sampling by the sampling to an end of the sampling, and
a minimum time of the current-driven period in the plural types of PWM load devices or a time shorter than the minimum time is set as a sampling cycle by the sampling unit.

10. The drive current detection device according to claim 1, wherein, instead of sampling the current flowing through the load device a plurality of times, the sampling unit samples a voltage equivalent to the current flowing through the load device.

11. A fault detection device comprising:
the drive current detection device according to claim 1; and
a fault determination unit that performs detection of a fault of the load device by using the drive current value for determining whether or not there is a fault in the load device, the drive current value being decided by the drive current detection device.

12. The fault detection device according to claim 11, wherein output of a voltage to the PWM load device is stopped based on the detection of the fault.

13. A fault detection device for a load device in which a drive voltage or a drive current is controlled in a PWM mode, the fault detection device comprising:
a sampling unit that periodically samples a current a plurality of times, the current flowing through the load device;
a drive current arithmetic operation unit that (i) decides a threshold value based on sampled values, (ii) detects a period when a PWM waveform is not generated in the current flowing through the load device based on the threshold value, (iii) selects sampled values in the period when the PWM waveform is not generated from among the sampled values, and (iv) decides a current value for determining whether or not there is a fault in the load device; and
a fault determination unit that performs detection of a fault of the load device by using the current value for determining whether or not there is a fault.

14. A drive current detection method for a load device in which a drive voltage or a drive current is controlled in a PWM mode, the drive current detection method comprising:
periodically sampling a current a plurality of times, the current flowing through the load device;
deciding a threshold value based on sampled values, and detecting a current-driven period in the current flowing through the load device based on the threshold value; and
selecting sampled values in the current-driven period from among the sampled values, and deciding a drive current value for determining whether or not there is a fault in the load device.

15. A fault detection method, wherein the detection of a fault in the load device is performed by using the drive current value for determining whether or not there is a fault, the drive current value being decided by the drive current detection method according to claim 14.

* * * * *